US010530185B2

(12) United States Patent
Venkatesan et al.

(10) Patent No.: US 10,530,185 B2
(45) Date of Patent: Jan. 7, 2020

(54) SYSTEMS AND METHODS FOR TRANSMITTING DATA VIA A CONTACTLESS CYLINDRICAL INTERFACE

(71) Applicant: Velodyne LiDAR, Inc., San Jose, CA (US)

(72) Inventors: Pravin Kumar Venkatesan, Fremont, CA (US); Abhilash Goyal, Fremont, CA (US); William B Etheridge, San Mateo, CA (US); Rajesh Ramalingam Varadharajan, San Jose, CA (US)

(73) Assignee: Velodyne Lidar, Inc., San Jose, CA (US)

( * ) Notice: Subject to any disclaimer, the term of this patent is extended or adjusted under 35 U.S.C. 154(b) by 143 days.

(21) Appl. No.: 15/897,814

(22) Filed: Feb. 15, 2018

(65) Prior Publication Data

US 2019/0252916 A1 Aug. 15, 2019

(51) Int. Cl.
*H02J 50/05* (2016.01)
*H04B 5/00* (2006.01)
*H03M 5/12* (2006.01)
*G01S 17/88* (2006.01)

(52) U.S. Cl.
CPC .............. *H02J 50/05* (2016.02); *G01S 17/88* (2013.01); *H03M 5/12* (2013.01); *H04B 5/0012* (2013.01); *H04B 5/0037* (2013.01)

(58) Field of Classification Search
CPC .......... H02J 50/05; G01S 17/88; H03M 5/12; H04B 5/0012; H04B 5/0037
See application file for complete search history.

(56) References Cited

U.S. PATENT DOCUMENTS

| 4,598,325 | A | 7/1986 | Tarzaiski |
| 10,177,820 | B1 | 1/2019 | Kirby et al. |
| 2002/0132589 | A1 | 9/2002 | Kojima et al. |
| 2015/0228403 | A1 | 8/2015 | Zwemmer et al. |
| 2016/0329747 | A1 | 11/2016 | Lenius et al. |

OTHER PUBLICATIONS

Written Opinion of the International Searching Authority, dated Apr. 25, 2019, in International Patent Application PCT/US2019/016265, filed Feb. 1, 2019 (5 pgs).
International Search Report, dated Apr. 25, 2019, in International Patent Application PCT/US2019/016265, filed Feb. 1, 2019 (2 pgs).

*Primary Examiner* — Robert L Deberadinis
(74) *Attorney, Agent, or Firm* — Goodwin Procter LLP (57) ABSTRACT

Described herein are systems and methods that create a capacitive link based on a rotating cylinder capacitor. A cylindrical rotor rotates around a shaft and maintains an air gap between the cylindrical rotor and the shaft and to create one or more air gap capacitors. A first subsystem, comprising a light detection and ranging components, is coupled to the rotor. A second sub-subsystem, comprising data analysis functions, is coupled to the shaft. The first subsystem and the second subsystem are coupled via capacitive links created by the air gap capacitors. The communication signaling utilized on the capacitive links may be bi-directional and differential signaling. The first subsystem and the second subsystem may comprise a LIDAR light detection and ranging system. The second subsystem may power the first subsystem via inductive coupling.

20 Claims, 10 Drawing Sheets

For LiDAR the light source is a laser

Single emitter/detector pair rotating mirror lidar design

Air gap cylinder capacitor: b − a = air gap

Capacitive Link

FIG. 4B

Rings 506 and 510 create capacitor C1;
Rings 508 and 512 create capacitor C2
Two capacitive links needed for differential signaling

SYSTEMS AND METHODS FOR TRANSMITTING DATA VIA A CONTACTLESS CYLINDRICAL INTERFACE

BACKGROUND

A. Technical Field

The present disclosure relates generally to systems and methods for transmitting data via capacitive coupling, and more particularly the utilization of a rotating capacitor data link within a light detection and ranging system (LIDAR).

B. Background

In some electronic systems, there may be a requirement to transmit data within the electronic system by a wireless or non-contact (contactless) method. Possible wireless or non-contact methods may include a wireless technology, an optical link, mercury electrical contact, inductive coupling and capacitive coupling. The term "capacitive" relates to electrical capacitance, or the property of being able to collect and hold a charge of electricity. The selected method may impact the performance and efficiency of electronic system including, but not limited to the frequency of operation, bandwidth, transmission speed and power consumption. In some embodiments, such as a LIDAR system, the data may be transferred between a stationary component and a non-stationary rotating component.

Accordingly, what is needed are systems and methods that provide an efficient wireless or non-contact method for data transmission between one component of the electronic system and the rest of the electronic system. The one component of the electronic system may be stationary relative to the rest of the electronic system. Or the one component of the electronic system may be rotating relative to the rest of the electronic system.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures are not to scale.

DETAILED DESCRIPTION OF EMBODIMENTS

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

The terms "include," "including," "comprise," and "comprising" shall be understood to be open terms and any lists the follow are examples and not meant to be limited to the listed items. Any headings used herein are for organizational purposes only and shall not be used to limit the scope of the description or the claims. Each reference mentioned in this patent document is incorporate by reference herein in its entirety.

Furthermore, one skilled in the art shall recognize that: (1) certain steps may optionally be performed; (2) steps may not be limited to the specific order set forth herein; (3) certain steps may be performed in different orders; and (4) certain steps may be done concurrently.

A. Light Detection and Ranging System

A light detection and ranging system, such as a LIDAR system, may be a tool to measure the shape and contour of the environment surrounding the system. LIDAR systems may be applied to numerous applications including both autonomous navigation and aerial mapping of a surface. LIDAR systems emit a light pulse that is subsequently reflected off an object within the environment in which a system operates. The time each pulse travels from being emitted to being received may be measured (i.e., time-of-flight "TOF") to determine the distance between the object and the LIDAR system. The science is based on the physics of light and optics.

In a LIDAR system, light may be emitted from a rapidly firing laser. Laser light travels through a medium and reflects off points of things in the environment like buildings, tree branches and vehicles. The reflected light energy returns to a LIDAR receiver (detector) where it is recorded and used to map the environment.

Figure 1:
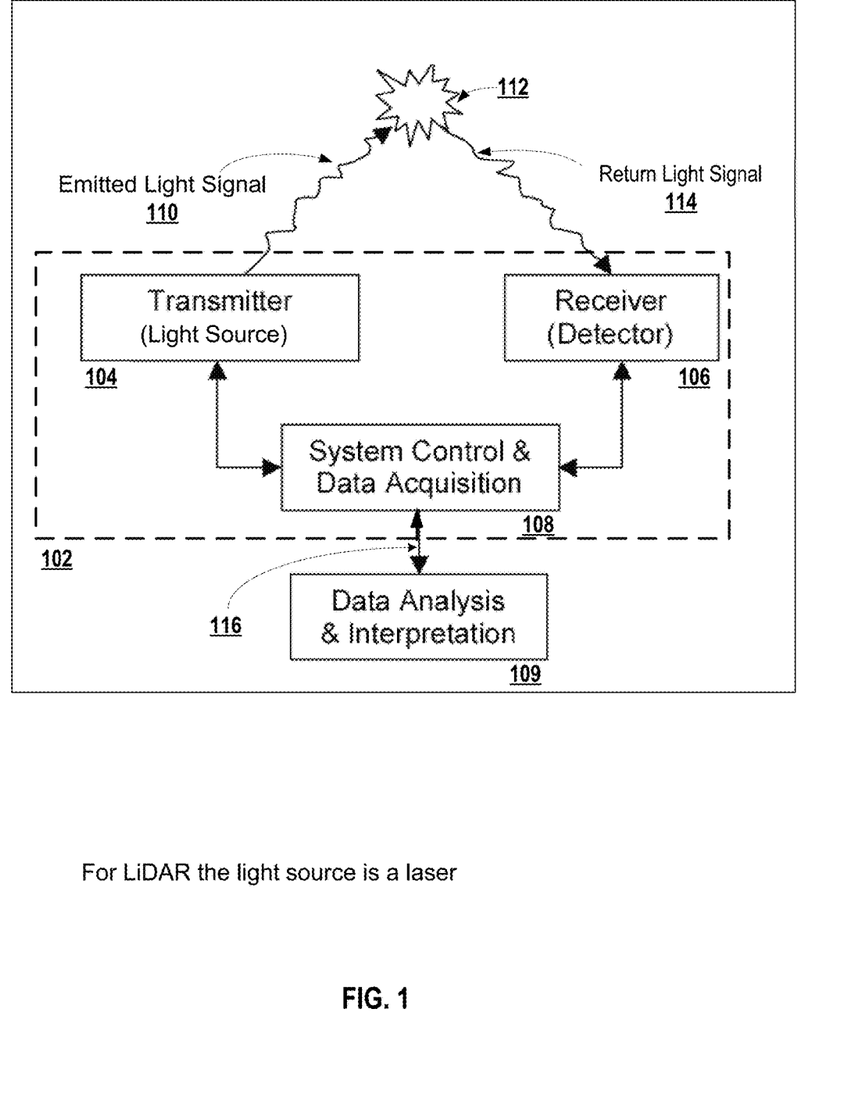
FIG. 1 depicts the operation of a light detection and ranging system according to embodiments of the present document.

FIG. 1 depicts operation 100 of a light detection and ranging components 102 and data analysis & interpretation 109 according to embodiments of the present document. Light detection and ranging components 102 may comprise a transmitter 104 that transmits emitted light signal 110, receiver 106 comprising a detector, and system control and data acquisition 108. Emitted light signal 110 propagates through a medium and reflects off object 112. Return light signal 114 propagates through the medium and is received by receiver 106. System control and data acquisition 108 may control the light emission by transmitter 104 and the data acquisition may record the return light signal 114 detected by receiver 106. Data analysis & interpretation 109 may receive an output via connection 116 from system control and data acquisition 108 and perform data analysis functions. Connection 116 may be implemented with a wireless or non-contact communication method. Transmitter 104 and receiver 106 may include an optical lens (not shown). Transmitter 104 may emit a laser beam having a plurality of pulses in a particular sequence. In some embodiments, light detection and ranging components 102 and data analysis & interpretation 109 comprise a LIDAR system.

Figure 2:
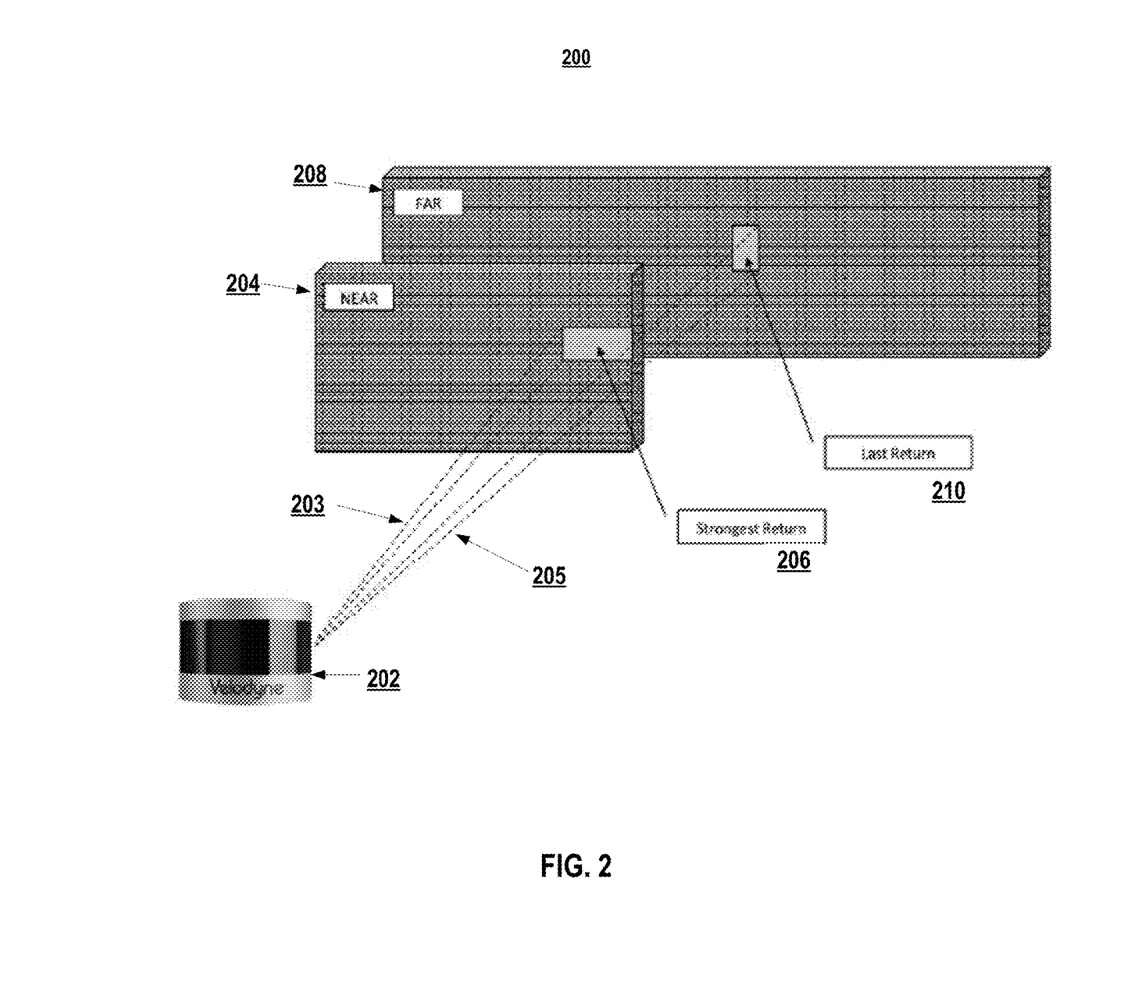
FIG. 2 illustrates the operation of a light detection and ranging system and multi-return light signals according to embodiments of the present document.

FIG. 2 illustrates the operation 200 of light detection and ranging system 202 including multi-return light signals: (1) return signal 203 and (2) return signal 205 according to embodiments of the present document. Light detection and ranging system 202 may be a LIDAR system. Due to the laser's beam divergence, a single laser firing often hits multiple objects producing multiple returns. The light detection and ranging system 202 may analyze multiple returns and may report either the strongest return, the last return, or both returns. Per FIG. 2, light detection and ranging system 202 emits a laser in the direction of near wall 204 and far wall 208. As illustrated, the majority of the beam hits the near wall 204 at area 206 resulting in return signal 203, and another portion of the beam hits the far wall 208 at area 210 resulting in return signal 205. Return signal 203 may have a shorter TOF and a stronger received signal strength compared with return signal 205. Light detection and ranging system 202 may record both returns only if the distance between the two objects is greater than minimum distance.

In both single and multi-return LIDAR systems, it is important that the return signal is accurately associated with the transmitted light signal so that an accurate TOF is calculated.

Some embodiments of a LIDAR system may capture distance data in a 2-D (i.e. single plane) point cloud manner. These LIDAR systems may be often used in industrial applications and may be often repurposed for surveying, mapping, autonomous navigation, and other uses. Some embodiments of these devices rely on the use of a single laser emitter/detector pair combined with some type of moving mirror to effect scanning across at least one plane. This mirror not only reflects the emitted light from the diode, but may also reflect the return light to the detector. Use of a rotating mirror in this application may be a means to achieving 90-180-360 degrees of azimuth view while simplifying both the system design and manufacturability.

Figure 3:
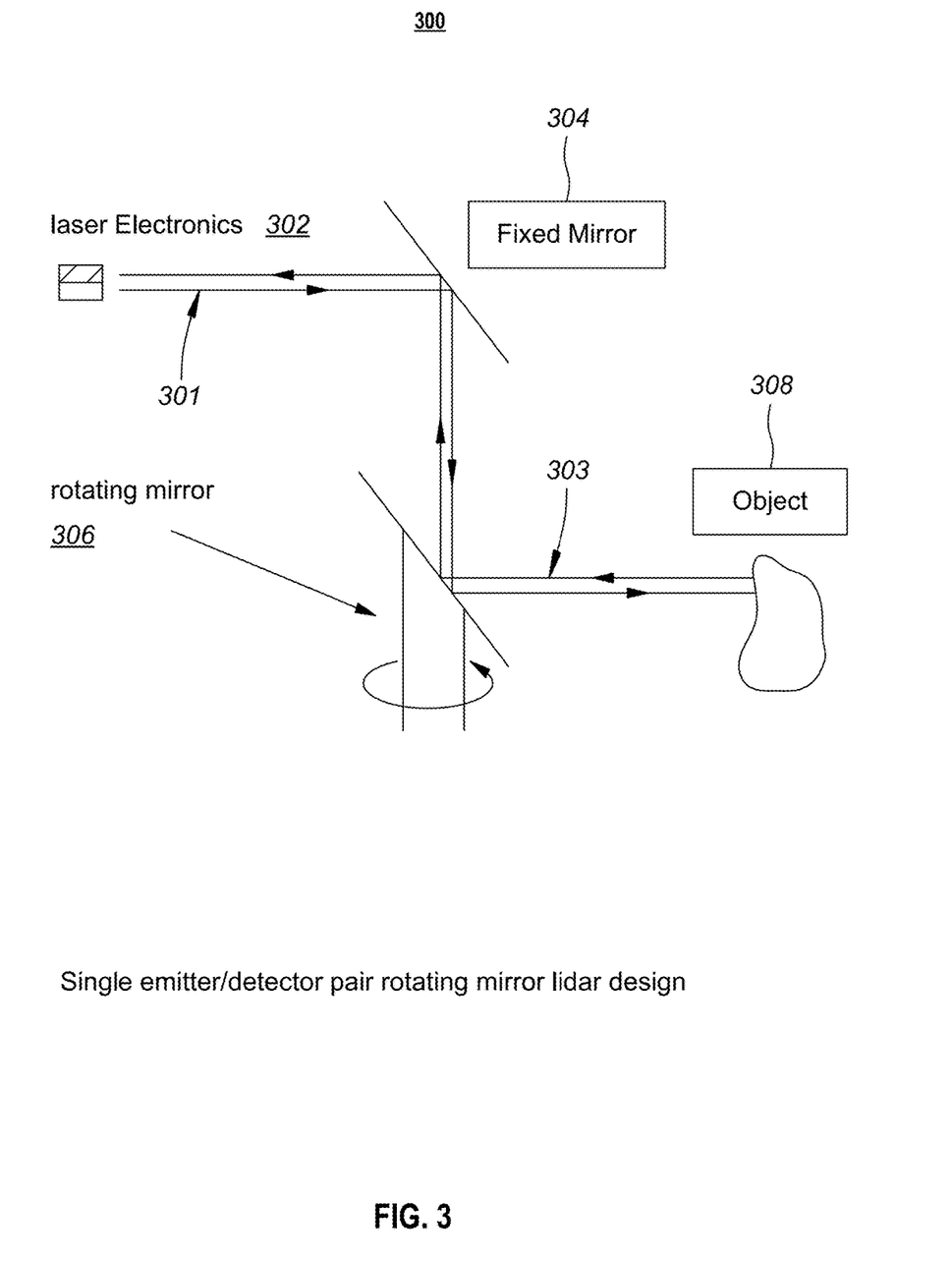
FIG. 3 depicts a LIDAR system with a rotating mirror according to embodiments of the present document.

FIG. 3 depicts a LIDAR system 300 with a rotating mirror according to embodiments of the present document. LIDAR system 300 employs a single laser emitter/detector combined with a rotating mirror to effectively scan across a plane. Distance measurements performed by such a system are effectively two-dimensional (i.e., planar), and the captured distance points are rendered as a 2-D (i.e., single plane) point cloud. In some embodiments, but without limitations, rotating mirrors are rotated at very fast speeds e.g., thousands of revolutions per minute. A rotating mirror may also be referred to as a spinning mirror.

LIDAR system 300 comprises laser electronics 302, which comprises a single light emitter and light detector. The emitted laser signal 301 may be directed to a fixed mirror 304, which reflects the emitted laser signal 301 to rotating mirror 306. As rotating mirror 306 "rotates", the emitted laser signal 301 may reflect off object 308 in its propagation path. The reflected signal 303 may be coupled to the detector in laser electronics 302 via the rotating mirror 306 and fixed mirror 304.

As previously noted, time of flight or TOF is the method a LIDAR system uses to map the environment and provides a viable and proven technique used for detecting target objects. Simultaneously, as the lasers fire, firmware within a LIDAR system may be analyzing and measuring the received data. The optical receiving lens within the LIDAR system acts like a telescope gathering fragments of light photons returning from the environment. The more lasers employed in a system, the more the information about the environment may be gathered. Single laser LIDAR systems may be at a disadvantage compared with systems with multiple lasers because fewer photons may be retrieved, thus less information may be acquired. Some embodiments, but without limitation, of LIDAR systems have been implemented with 8, 16, 32, 64 and 128 lasers. Also, some LIDAR embodiments, but without limitation, may have a vertical field of view (FOV) up to 120 degrees with laser beam spacing as tight as 0.1 degree and may have rotational speeds of 5-20 rotations per second.

The rotating mirror functionality may also be implemented with a solid state technology such as MEMS.

B. Capacitor Coupling

In some electronic systems such as a LIDAR system, there may be a requirement to transmit data within the electronic system by a wireless or non-contact method. Alternative wireless or non-contact methods may include a wireless technology, mercury electrical contacts, optical links, inductive coupling and capacitive coupling. In a review of the characteristics of these alternatives, capacitive coupling may have advantages. For example, as compared to capacitive coupling, wireless technologies may require 30× to 40× more power and be more expensive; inductive coupling may only provide ⅒ of the frequency of transmission; mercury electrical contacts may not be suitable for automotive applications and optical communication is limited to one link of data transmission. Except for optical communications, the alternatives may have a slower data transfer than capacitor coupling.

In some embodiments, referring to the LIDAR system of FIG. 1, light detection and ranging components 102 may be located on a rotor and data analysis & interpretation 109 may be located on a shaft that is inserted in the center of the rotor. In operation, the rotor rotates around the shaft with an air gap capacitor between the rotor and the shaft. This structure requires a wireless or non-contact connection. The air gap capacitor facilitates a capacitive link, i.e., connection 116, between light detection and ranging components 102 and data analysis & interpretation 109. In some other embodiments, portions of the data analysis functions may be located on the rotor.

Inductive coupling may be a functional solution to provide a data transfer and power transfer between light detection and ranging components 102 and data analysis & interpretation 109. Two conductors are referred to as inductively coupled or magnetically coupled when they are configured such that a change in current through one wire induces a voltage across the ends of the other wire through electromagnetic induction. The amount of inductive coupling between two conductors is measured by their mutual inductance. The voltage across an inductor is proportional to the rate of change of the applied voltage but is lagging rather than leading. Inductive coupling may generate unwanted parasitic oscillations that may limit the frequency of transmission. As previously noted, inductive coupling may provide a lower data transfer speed as compared to capacitor coupling.

Capacitance is the ratio of the change in an electric charge in a system to the corresponding change in its electric potential. That is, an electric field causes charges in conductors to move toward the gap between the conductors. A simple capacitor includes two plates separated by an insulating gap. The insulating gap may be an air gap. When voltage is applied to the capacitor terminals, electrons move from one plate to the other, leaving one positively charged and one negatively charged. The current into a capacitor is proportional to the rate of change of the voltage and leads the voltage in phase when AC is applied.

Capacitive coupling is the transfer of alternating electrical signals or energy from one segment of a circuit to another using a capacitor. The coupling provides a medium for the ac signals while blocking the dc energy. Capacitive coupling may also be called AC coupling and may be used in digital circuits to transmit digital signals with a zero DC component, known as DC-balanced signals. DC-balanced waveforms may be useful in communications systems since they can be used instead of AC-coupled electrical connections to avoid voltage imbalance problems and charge accumulation between connected systems or components. Most modern line codes are designed to produce DC-balanced waveforms including unipolar, polar, bipolar, and Manchester encoding/decoding.

Figure 4A:
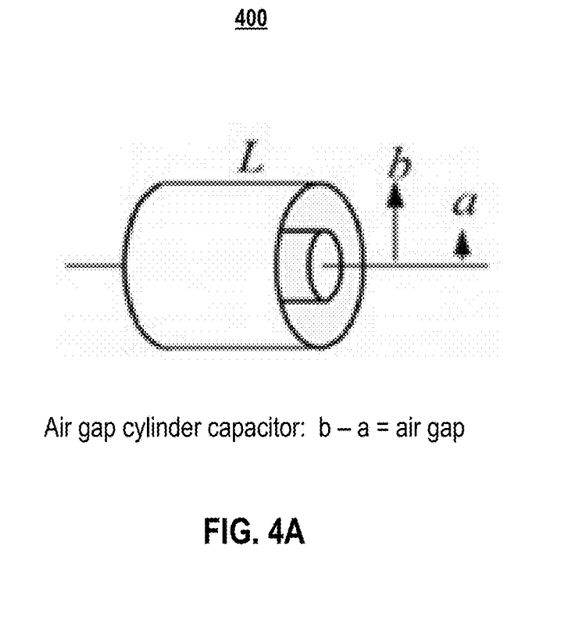
FIG. 4A depicts a concentric cylinder capacitance according to embodiments of the present document.

FIG. 4A depicts a concentric cylinder capacitance 400 according to embodiments of the present document. Concentric cylinder capacitance 400 may comprise two concentric cylinders where a=radius of the inner cylinder, b=radius of the outer cylinder and L=length of both cylinders. The capacitance air gap is equal to b–a. The capacitance of the two concentric cylinders is as follows:

$$C = \frac{2\pi\varepsilon_o\varepsilon_r}{\ln(b/a)}L$$

where $\varepsilon_o$ is the dielectric constant over air and $\varepsilon_r$ is a relative dielectric.

The concentric cylinder capacitance 400 maintains its value if the outer cylinder rotates around a stationary inner cylinder, or vice versus.

Figure 4B:
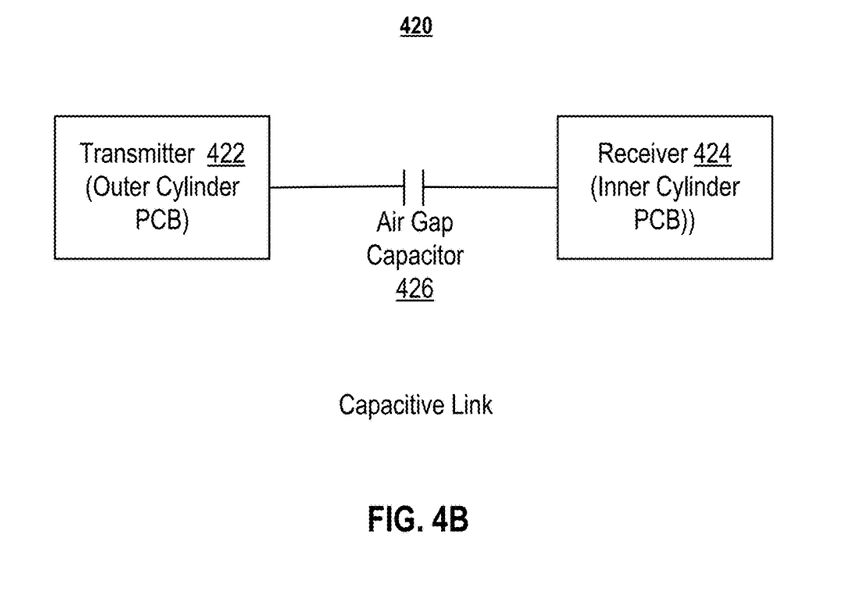
FIG. 4B depicts a capacitive link between a receiver and transceiver according to embodiments of the present document.

FIG. 4B depicts a capacitive link 420 between a receiver 424 and transmitter 422 according to embodiments of the present document. As illustrated, transmitter 422 may be a component of a PCB (printed circuit board) located on an outer cylinder of a concentric cylinder, for example, concentric cylinder 400. Receiver 424 may be a component of a PCB located on an inner cylinder of a concentric cylinder, for example, concentric cylinder 400. Transmitter 422 and receiver 424 may be capacitor coupled via air gap capacitor 426, thus creating a capacitive link between receiver 424 and transmitter 422. Outer cylinder PCB may be rotating around a stationary inner cylinder PCB or vice versa.

FIG. 4B illustrates a capacitive link supported by air gap capacitor 426. This capacitive link supports a single communication link. If additional communication links are desired, additional air gap capacitors may be required. For example, two of air gap capacitor 426 may provide two communication links and support either a bi-directional or differential signaling. It follows that four of air gap capacitor 426 may provide four communication links and may support bi-directional differential signaling.

C. Capacitive Link

Some embodiments of non-contact coupling between components in a system may be based on inductive coupling. A rotating beam and fixed cylindrical beam may have two inductive coupling connections, one for the transfer of data and one for powering the other device. Two inductive coupling connections in differential mode may provide improved signal integrity as compared with a single inductive link. Improved signal integrity means that the signal is transferred between two points with improved (i.e. reduced) distortion and signal loss.

The present documents describe methods and apparatus that utilize capacitive coupling to replace inductive coupling to enable faster data transfer. One inductor may be replaced with two capacitors to support differential signaling. Effective data rates may be 1 Gbps. With the evolution of design, future data rates may be 10 Gbps. The methods and apparatus are based on using an air gap between a rotating electrode plate and a fixed electrode plate to create a capacitive link between a one PCB and another PCB of a system. In some embodiments of non-contact links, the data may be transferred utilizing a capacitive link and the power may be transferred utilizing an inductive link. A dedicated path (capacitive link) for the data transfer may avoid noise associated with energy transfer to provide interference cancellation.

Figure 5A:
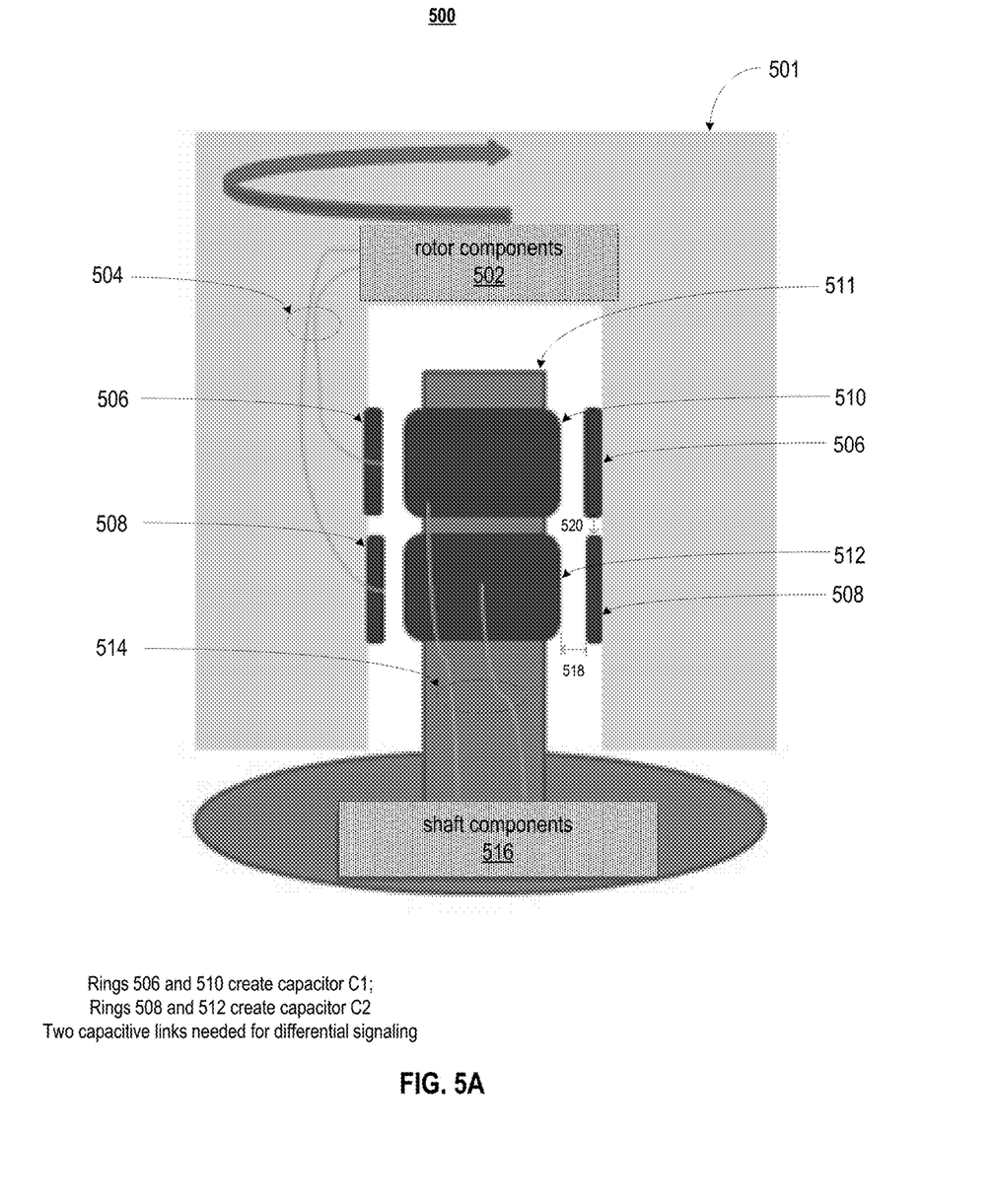
FIG. 5A depicts a rotor-shaft structure of a rotor and a shaft according to embodiments of the present document.

FIG. 5A depicts the rotor-shaft structure 500 of a rotor 501 and a shaft 511 according to embodiments of the present document. Rotor 501 may have a cylindrical shape and comprise a cylindrical hole in the center of rotor 501. Shaft 511 may be positioned inside the cylindrical hole. As illustrated, rotor 501 rotates around shaft 511. These components may be included in a LIDAR system. Rotor 501 may comprise rotor components 502 and shaft 511 may comprise shaft components 516. Included in rotor components 502 is a top PCB and included in shaft components 516 is a bottom PCB. In some embodiments, rotor components 502 may comprise light detection and ranging components 102 and shaft components 516 may comprise data analysis & interpretation 109 of FIG. 1.

Coupled to rotor components 502 via connections 504 are ring 506 and ring 508. Ring 506 and ring 508 are circular bands located on the inner or inside surface of rotor 501 and provide electrode plate functionality for one side of the air gap capacitor. Coupled to shaft components 516 via connections 514 are ring 510 and ring 512. Ring 510 and ring 512 are circular bands located on the outer surface of shaft 511 and provide electrode plate functionality for the other side of the air gap capacitor. A capacitor C1 may be created based on a space between ring 506 and ring 510. Another capacitor C2 may be created based on a space between ring 508 and ring 512. The capacitance for the aforementioned capacitors may be defined, in part, by air gap 518 and the width of the capacitive rings 506, 508, 510 and 512. Ring 506 and ring 508 are rotor rings, and ring 510 and ring 512 are shaft rings.

Ring 506 and ring 510 are the electrode plate components of capacitor C1 and ring 508 and ring 512 are the electrode plate components of capacitor C2. The vertical gap 520 between ring 506 and ring 508 may impact the performance of a capacitive link between capacitor C1 and capacitor C2 inasmuch as the value of the vertical gap 520 may determine a level of interference between the two capacitors. One skilled in the art will recognize that rotor 501 and shaft 511 may each comprise N rings that may support N capacitive links.

Figure 5B:
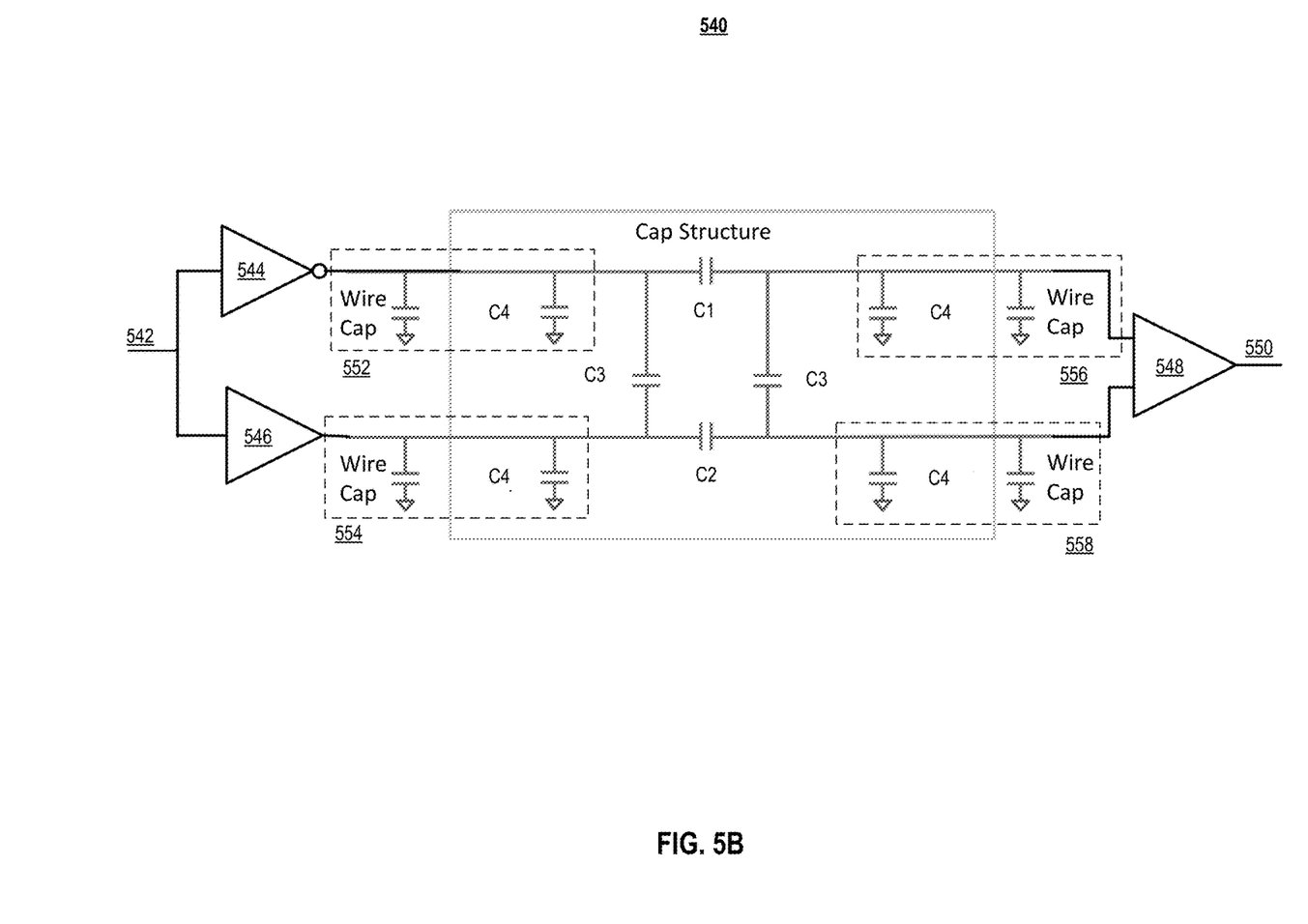
FIG. 5B depicts two capacitive links providing a single direction differential signaling according to embodiments of the present document.

FIG. 5B depicts capacitive links 540 providing a single direction differential signaling according to embodiments of the present document. Capacitive links 540 may be implemented as part of the rotor-shaft structure 500 of FIG. 5A. A multi-return light signal may be received in rotor components 502 and subsequently decoded and processed resulting in signal 542. In order to achieve a quality transfer of data to the shaft components 516 with minimal noise, differential signaling may be utilized. According, signal 542 may be coupled to inverter 544 and amplifier 546. The output of inverter 544 is coupled to ring 552, which is equivalent to ring 506 of FIG. 5A. Amplifier 546 is coupled to ring 554, which is equivalent to ring 508 of FIG. 5A. Ring 552 and Ring 554 may be each aligned with an air-gap to corresponding ring 556 and ring 558 to create capacitors, C1 and C2, respectively. The resulting differential signals are coupled to differential amplifier 548 to generate signal 550. Hence, to provide differential signaling, two capacitive links may be required. One capacitive link is provided by capacitor C1, and another capacitive link is provided by capacitor C2. To provide bi-directional differential signaling, four capacitive links may be required. The capacitors labeled "wire cap" may also be referred to as "board routing capacitor".

Typical values for the capacitors may be as follows: C1=C2=10.9 pF; C3=2.25 pF; and C4=2.25 pF. As previously noted, capacitors C1 and C2 are defined based on air gap 518 of FIG. 5A. Capacitors C3 are defined based on vertical gap 520. In some embodiments, air gap 518 may be equal to 5 mil and vertical gap 520 may be equal to a vertical gap of 1.53 mm and a height of 6.35 mm. Based on these values, typical C1 and C2 capacitors may be 10 pF to 15 PF. Larger air gap capacitors, C1 and C2, may further improve the performance of the capacitive link including higher transmission data rates. Future designs may achieve 50 pF to 200 pF In some embodiments, a variation or tolerance of less than 20% for the values of capacitors C1 and C2 may be required for operation of a LIDAR system. Capacitors C3 and C4 are parasitic capacitors and each of the C3 capacitors and each of the C4 capacitors may have different values. It is desirable that the values of C3 and C4 are minimized in order to maximum performance.

Rotor-shaft structure 500 of FIG. 5A may be configured with more than two rings on rotor 501 and more than two corresponding rings on shaft 511. As previously discussed, bi-directional signaling or differential signaling may be transmitted with two rings on rotor 501 and two corresponding rings on shaft 511. For bi-directional differential signaling, four rings are required on rotor 501 and four corresponding rings on shaft 511. This configuration supports four separate communication links. Effectively, the number of communication links provided by the architecture of rotor-shaft structure 500 is scalable. To add additional communication links via capacitor coupling, an additional pair of rings may be added (i.e., stacked) on rotor 501 and shaft 511. The mechanical specification for the additional rings may be based, in part, on air gap 518 and vertical gap 520. In summary, rotor-shaft structure 500 implements a contactless cylindrical interface based on capacitor coupling.

Figure 6:
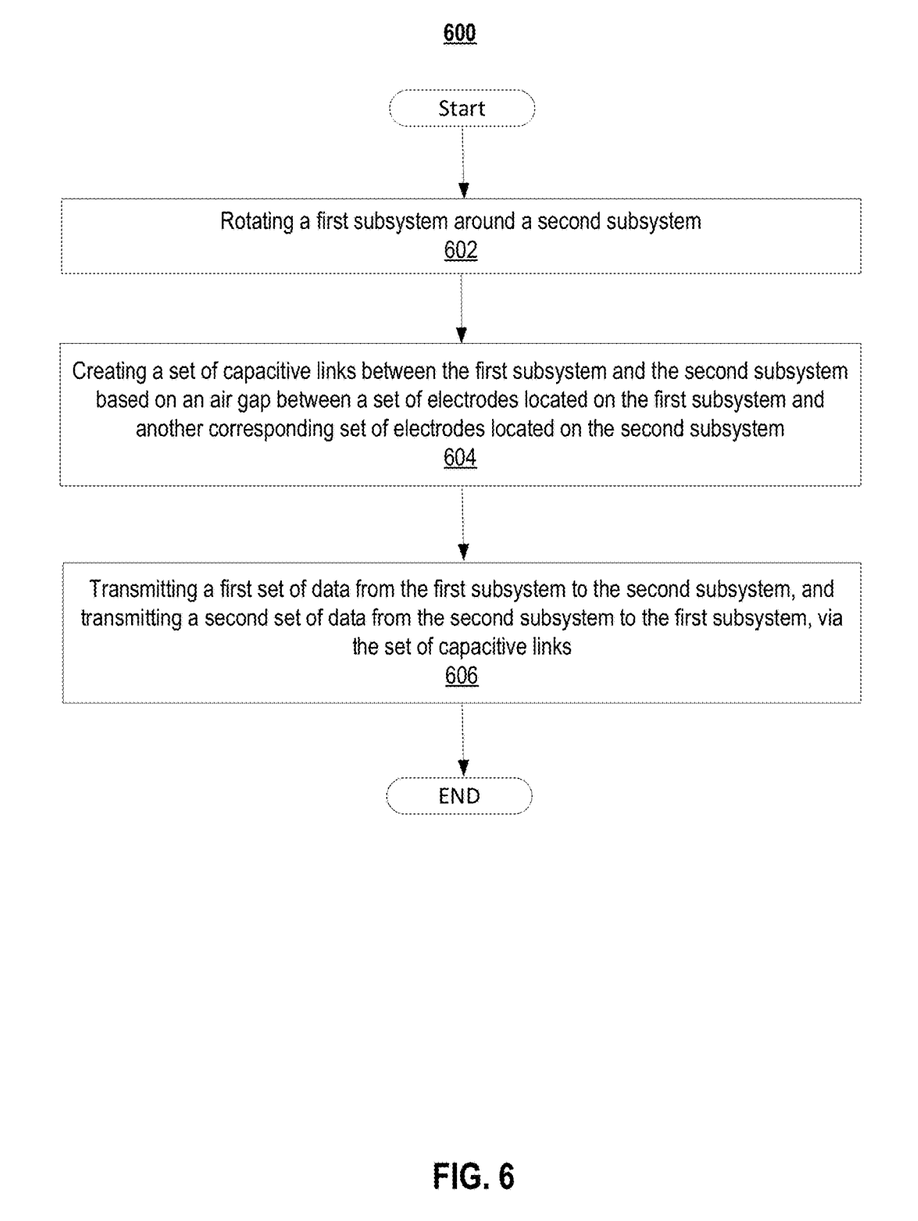
FIG. 6 depicts a flowchart for creating capacitive links according to embodiments of the present invention.

FIG. 6 depicts a flowchart 600 for creating capacitive links according to embodiments of the present invention. The method comprises the steps of:

Rotating a first subsystem around a second subsystem. (step 602)

Creating a set of capacitive links between the first subsystem and the second subsystem based on an air gap between a set of electrodes located on the first subsystem and another corresponding set of electrodes located on the second subsystem. (step 604)

Transmitting a first set of data from the first subsystem to the second subsystem, and transmitting a second set of data from the second subsystem to the first subsystem, via the set of capacitive links. (step 606)

When the number of electrodes in each set of electrodes is equal to four, the set of capacitive links comprises four communication links. Bi-directional differential signaling may be utilized for the transmission of data between the first subsystem and the second subsystem with the four communication links. The method may include: encoding and decoding bi-directional differential signals with a Manchester; processing bi-directional differential signals with an error detecting code; and powering the first subsystem by the second subsystem via inductive coupling. The error correction code may be a cyclic redundancy check (CRC). Manchester encoding/decoding may improve the signaling transition time and frequency of operation. In some embodiments, when the number of electrodes in each of the sets of electrodes is equal to N, the set of capacitive links comprises N communication links.

As discussed, a system according to embodiments of the current document may comprises a cylindrical rotor comprising a cylindrical hole in a center of the cylindrical rotor; one or more rotor rings that are attached to inside of the cylindrical hole of the cylindrical rotor; a first transceiver located on and coupled to the cylindrical rotor; a shaft positioned inside the cylindrical hole in the center of the cylindrical rotor. The cylindrical rotor may rotate around the shaft. The system may also comprise: a second transceiver located on and coupled to the shaft; one or more air gap capacitors created by an air gap between each pair of rings; one or more capacitive links coupled between the first transceiver and the second transceiver based on the one or more air gap capacitors.

The one or more capacitive links may create one or more corresponding separate connections between the first transceiver and the second transceiver. The cylindrical rotor and the shaft may comprise N corresponding pairs of rings. A bi-directional differential signal is transmitted and received by the first transceiver and the second transceiver utilizing four capacitive links. The capacitive links may utilize a low voltage differential signaling (LVDS) protocol, or the capacitive links utilize Serializer/Deserializer (SERDES) interfaces. The bi-directional differential signal may be encoded and decoded with a Manchester code. The bi-directional differential signal may be processed with an error detecting code such as a cyclic redundancy check (CRC). The first transceiver and second transceiver may comprise a LIDAR system.

D. Implementing a Capacitive Link

Figure 7:
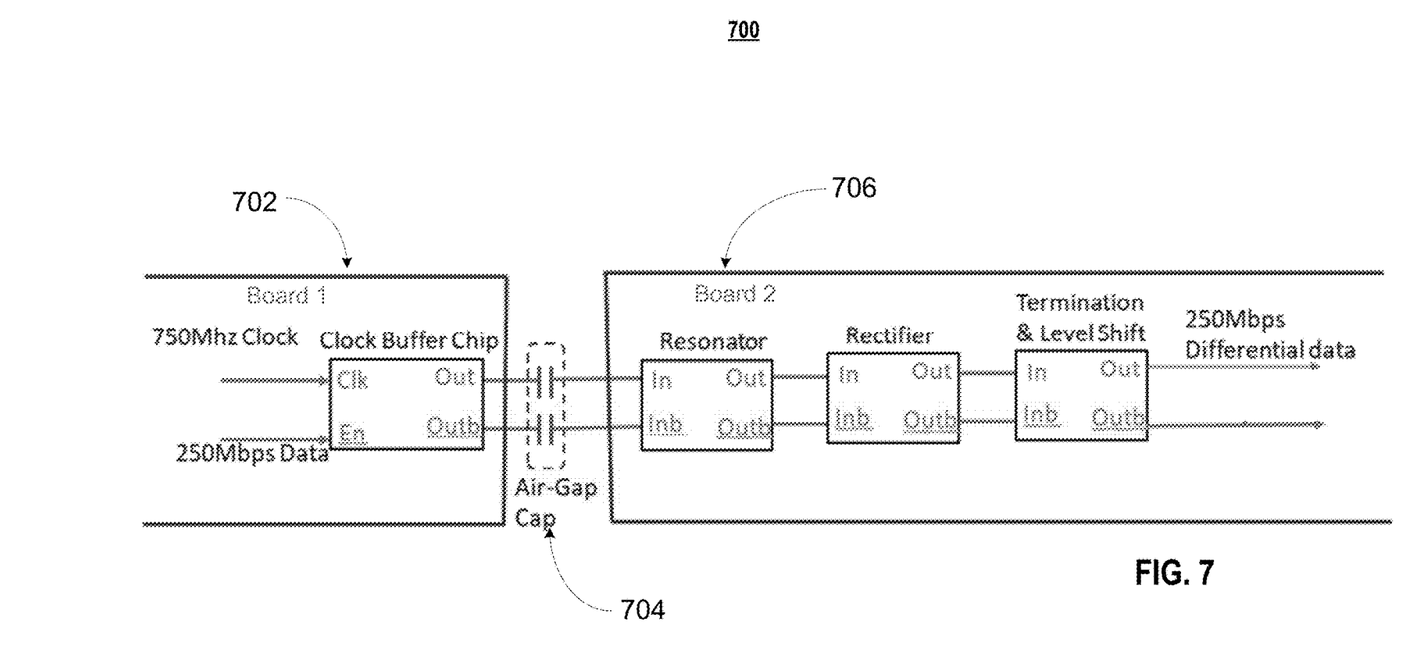
FIG. 7 depicts a system for implementing a capacitive link with custom protocols according to embodiments of the present document.

Two approaches to implement a capacitive link with custom protocols will be discussed. The first approach is discussed relative to FIG. 7. The second approach, based on Serializer/Deserializer (SERDES) interfaces, is discussed relative to FIG. 8. FIG. 7 depicts a system 700 for implementing a capacitive link with custom protocols according to embodiments of the present document. Characteristics of system 700 include: low latency, low cost and lower max speed (~250 Mbps). System 700 comprises board 1 702, air gap capacitor 704 and board 2 706. A 750 Mhz clock a 250 Mbps data from are coupled to a clock buffer chip as illustrated in FIG. 7. The two outputs of the clock buffer chip are each coupled to one of the two capacitors in air gap capacitor 704, and in turn, air gap capacitor 704 is coupled to board 2 706. In board 2 706, the data is processed in a resonator, rectifier, and termination & level shift. The subsequent outputs are 250 Mbps differential data.

Figure 8:
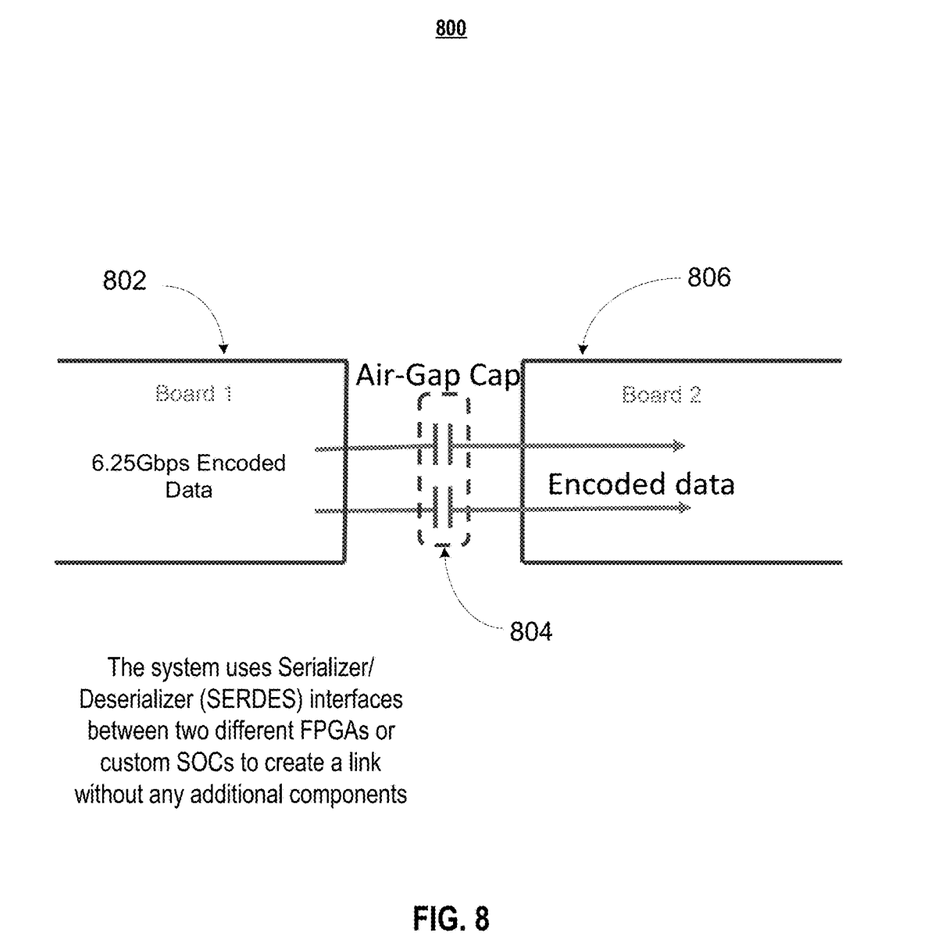
FIG. 8 depicts another system for implementing a capacitive link with custom protocols according to embodiments of the current disclosure.

FIG. 8 depicts another system 800 for implementing a capacitive link with custom protocols according to embodiments of the current disclosure. The system uses Serializer/ Deserializer (SERDES) interfaces between two different FPGAs (field programmable gate arrays) or custom SOCs (system on a chip) to create a link without any additional components. Characteristics of this system include high latency, FPGA's or SOC's with SERDES support; potential of higher speeds (~2 Gbps possible); and ease of implementation.

FIG. 8 comprises top PCB 802, air gap capacitor 804 and bottom PCB 806. In operation, 6.25 Gbps data is encoded through a FPGA and capacitor coupled via air gap capacitor 804. In turn, the signal with the encoded data is received by a FPGA in the bottom PCB 806.

The characteristics of system 800 include: Use internal SERDES from top and bottom FPGA for AC-coupled interface; higher speed SERDES may be preferred as AC cap acts as high-pass filter; a startup sequence for the SERDES to lock may be a concern if the signal relies on low speed patterns; and a need to check on the lowest frequency content during startup. It is assumed that 8b/10b encoding can be disabled. Otherwise, 8b/10b encoding or other coding schemes can also be used to maintain enough high frequency content, but there may be a need to check minimum frequency content and accept a lower bandwidth.

E. System Embodiments

In In embodiments, aspects of the present patent document may be directed to or implemented on information handling systems/computing systems. For purposes of this disclosure, a computing system may include any instrumentality or aggregate of instrumentalities operable to compute, calculate, determine, classify, process, transmit, receive, retrieve, originate, route, switch, store, display, communicate, manifest, detect, record, reproduce, handle, or utilize any form of information, intelligence, or data for business, scientific, control, or other purposes. For example, a computing system may be an optical measuring system such as a LIDAR system that uses time of flight to map objects within its environment. The computing system may include random access memory (RAM), one or more processing resources such as a central processing unit (CPU) or hardware or software control logic, ROM, and/or other types of memory. Additional components of the computing system may include one or more network or wireless ports for communicating with external devices as well as various input and output (I/O) devices, such as a keyboard, a mouse, touchscreen and/or a video display. The computing system may also include one or more buses operable to transmit communications between the various hardware components.

Figure 9:
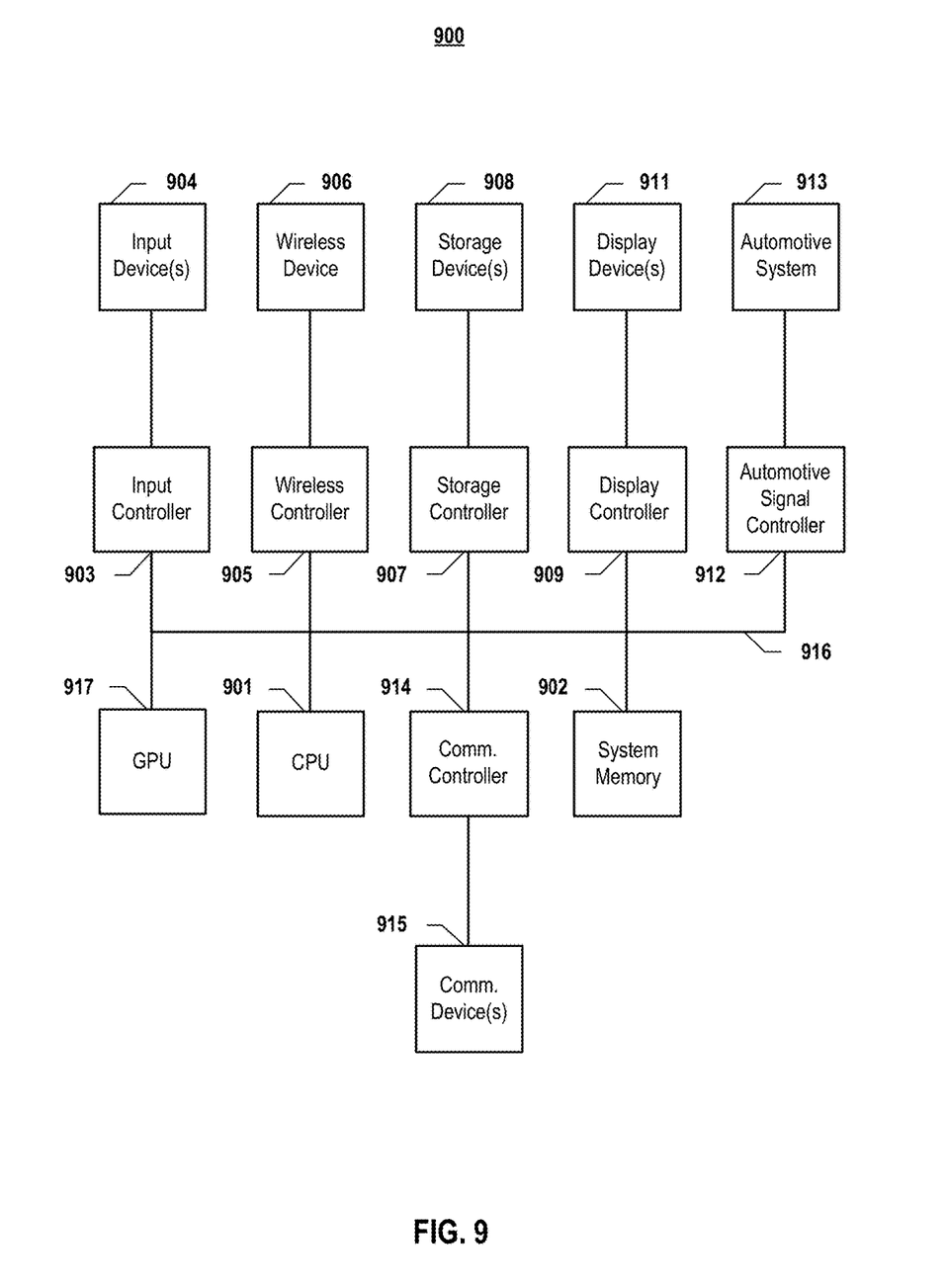
FIG. 9 depicts a simplified block diagram of a computing device/information handling system, in accordance with embodiments of the present document.

FIG. 9 depicts a simplified block diagram of a computing device/information handling system (or computing system) according to embodiments of the present document. It will be understood that the functionalities shown for system 900 may operate to support various embodiments of an information handling system—although it shall be understood that an information handling system may be differently configured and include different components.

As illustrated in FIG. 9, system 900 includes one or more central processing units (CPU) 901 that provides computing resources and controls the computer. CPU 901 may be implemented with a microprocessor or the like, and may also include one or more graphics processing units (GPU) 917 and/or a floating point coprocessor for mathematical computations. System 900 may also include a system memory 902, which may be in the form of random-access memory (RAM), read-only memory (ROM), or both.

A number of controllers and peripheral devices may also be provided, as shown in FIG. 9. An input controller 903 represents an interface to various input device(s) 904, such as a keyboard, mouse, or stylus. There may also be a wireless controller 905, which communicates with a wireless device 906. System 900 may also include a storage controller 907 for interfacing with one or more storage devices 908 each of which includes a storage medium such as flash memory, or an optical medium that might be used to record programs of instructions for operating systems, utilities, and applications, which may include embodiments of programs that implement various aspects of the present invention. Storage device(s) 908 may also be used to store processed data or data to be processed in accordance with the invention. System 900 may also include a display controller 909 for providing an interface to a display device 911. The computing system 900 may also include an automotive signal controller 912 for communicating with an automotive system 913. A communications controller 914 may interface with one or more communication devices 915, which enables system 900 to connect to remote devices through any of a variety of networks including an automotive network, the Internet, a cloud resource (e.g., an Ethernet cloud, an Fiber Channel over Ethernet (FCoE)/Data Center Bridging (DCB) cloud, etc.), a local area network (LAN), a wide area network (WAN), a storage area network (SAN) or through any suitable electromagnetic carrier signals including infrared signals.

In the illustrated system, all major system components may connect to a bus 916, which may represent more than one physical bus. However, various system components may or may not be in physical proximity to one another. For example, input data and/or output data may be remotely transmitted from one physical location to another. In addition, programs that implement various aspects of this invention may be accessed from a remote location (e.g., a server) over a network. Such data and/or programs may be conveyed through any of a variety of machine-readable medium including, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices.

Embodiments of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A system comprising:
    a cylindrical rotor comprising a cylindrical hole in a center of the cylindrical rotor;
    a transmitter located on and coupled to the cylindrical rotor;
    a shaft positioned inside the cylindrical hole;
    a receiver located on and coupled to the shaft; and
    a capacitive link that couples the transmitter to the receiver via an air gap capacitor positioned between the cylindrical rotor and the shaft.

2. The system of claim 1 further comprising:
    a first ring attached to an inside surface of the cylindrical hole of the cylindrical rotor;
    a second ring attached to an outer surface of the shaft; and
    wherein, an air gap between the first ring and the second ring creates the air gap capacitor.

3. The system of claim 1, wherein data is transmitted between the transmitter and the receiver via the capacitive link.

4. The system of claim 1, wherein the cylindrical rotor rotates around the shaft.

5. A system comprising:
    a cylindrical rotor comprising a cylindrical hole in a center of the cylindrical rotor;
    one or more rotor rings that are attached to an inside surface of the cylindrical hole of the cylindrical rotor;
    a first transceiver located on and coupled to the cylindrical rotor;
    a shaft positioned inside the cylindrical hole in the center of the cylindrical rotor, wherein the cylindrical rotor rotates around the shaft;
    one or more shaft rings that are attached on an outer surface of the shaft, wherein, each of the one or more rotor rings is paired with a corresponding one or more shaft rings;
    a second transceiver located on and coupled to the shaft;
    one or more air gap capacitors created by an air gap between each pair of rings; and
    one or more capacitive links coupled between the first transceiver and the second transceiver based on the one or more air gap capacitors.

6. The system of claim 5, wherein the one or more capacitive links create one or more corresponding separate connections between the first transceiver and the second transceiver.

7. The system of claim 5, wherein the cylindrical rotor and the shaft comprises N corresponding pairs of rings that support N capacitive links.

8. The system of claim 5, wherein a bi-directional differential signal is transmitted and received by the first transceiver and the second transceiver utilizing four capacitive links.

9. The system of claim 8, wherein the capacitive links utilize a low voltage differential signaling (LVDS) protocol.

10. The system of claim 8, wherein the capacitive links utilize Serializer/Deserializer (SERDES) interfaces.

11. The system of claim 8, wherein the bi-directional differential signal is encoded and decoded with a Manchester code.

12. The system of claim 8, wherein the bi-directional differential signal is processed with an error detecting code.

13. The system of claim 5, wherein the shaft provides power to the cylindrical rotor via inductive coupling.

14. A method comprising:
    rotating a cylindrical rotor around a shaft, wherein the cylindrical rotor comprises a first subsystem and the shaft comprises a second subsystem;
    creating a set of capacitive links between the first subsystem and the second subsystem based on an air gap between a set of electrodes located on the cylindrical rotor and another corresponding set of electrodes located on the second subsystem; and
    transmitting a first set of data from the first subsystem to the second subsystem and a second set of data from the second subsystem to the first subsystem via the set of capacitive links.

15. The method of claim 14, wherein when a number of electrodes in each of the sets of electrodes is equal to N, the set of capacitive links comprises N communication links.

16. The method of claim 14 further comprising:
    transmitting with bi-directional differential signaling over four capacitive links.

17. The method of claim 16, further comprising:
    encoding and decoding bi-directional differential signals with a Manchester code.

18. The method of claim 14, further comprising:
    powering the first subsystem by the second subsystem via inductive coupling.

19. The method of claim 14, wherein the first subsystem and the second subsystem comprise a LIDAR system.

20. The method of claim 14, wherein a tolerance of the air gap capacitor is less than 20%.

* * * * *